US006925316B2

(12) United States Patent
Rey

(10) Patent No.: US 6,925,316 B2
(45) Date of Patent: Aug. 2, 2005

(54) METHOD OF FORMING SUPERCONDUCTING MAGNETS USING STACKED LTS/HTS COATED CONDUCTOR

(75) Inventor: Christopher Mark Rey, Hockessin, DE (US)

(73) Assignee: Christopher M. Rey, Knoxville, TN (US)

( * ) Notice: Subject to any disclaimer, the term of this patent is extended or adjusted under 35 U.S.C. 154(b) by 34 days.

(21) Appl. No.: 10/379,500

(22) Filed: Mar. 5, 2003

(65) Prior Publication Data

US 2004/0082482 A1 Apr. 29, 2004

Related U.S. Application Data

(60) Provisional application No. 60/370,299, filed on Apr. 8, 2002.

(51) Int. Cl.[7] .......................... H01B 12/00; H01F 6/00; H01L 39/00

(52) U.S. Cl. ...................... 505/211; 505/237; 505/238; 505/705

(58) Field of Search ................................ 505/163, 166, 505/211, 212, 230, 237, 238, 320, 705; 335/216, 229, 300

(56) References Cited

U.S. PATENT DOCUMENTS 4,996,192 A * 2/1991 Fleischer .................... 505/126
5,034,373 A * 7/1991 Smith et al. ................ 505/432
5,116,810 A * 5/1992 Joshi et al. ................. 505/500
5,173,678 A * 12/1992 Bellows et al. ............. 505/211
5,231,074 A * 7/1993 Cima et al. ................. 505/434
5,292,716 A * 3/1994 Sakai et al. ................. 505/126
5,321,003 A * 6/1994 Joshi et al. ................. 505/220
5,525,583 A * 6/1996 Aized et al. ................ 505/211
5,550,103 A * 8/1996 Motowidlo et al. .......... 505/430
5,581,220 A * 12/1996 Rodenbush et al. ........ 335/216
5,602,080 A * 2/1997 Bednorz et al. ............ 505/451
5,604,473 A * 2/1997 Rodenbush ................. 335/216
5,696,057 A * 12/1997 McArdle .................... 505/452
5,705,457 A * 1/1998 Tamura et al. .............. 505/482
5,849,667 A * 12/1998 Murakami et al. .......... 505/125
5,872,080 A * 2/1999 Arendt et al. ............... 505/238
5,872,081 A * 2/1999 Woolf ........................ 505/450
5,906,964 A * 5/1999 Chu et al. ................... 505/230
5,968,877 A * 10/1999 Budai et al. ................ 505/237
5,972,847 A * 10/1999 Feenstra et al. ............ 505/473
6,083,855 A * 7/2000 Olson et al. ................ 442/180
6,154,599 A * 11/2000 Rey ........................... 385/141
6,711,421 B2 * 3/2004 Wang et al. ................ 505/166

* cited by examiner

*Primary Examiner*—Colleen P. Cooke

(57) ABSTRACT

A method of forming magnets using stacked superconducting films-disks of coated conductor is described. The superconducting material may be either from the oxide high temperature superconducting (HTS) class or the metallic/inter-metallic low temperature superconducting (LTS) class. An LTS metallic or inter-metallic compound can include Nb, Va, Ti, Hg, Pb, NbTi, $Nb_3Sn$, $Nb_3Al$, etc. or the more recently discover $MgB_2$. An oxide superconductor refers to the RE-$Ba_2Cu_3O_x$ compound, wherein RE=Y, Nd, La, Sm, Eu, Gd, Dy, Ho, Er, Tm, Yb, Lu; the $Bi_2Sr_2CaCu_2O_x$, the $(Bi, Pb)_2Sr_2CaCu_2O_x$, $Bi_2Sr_2Ca_2Cu_3O_x$ or $(Bi, Pb)_2Sr_2Ca_2Cu_3O_x$ compound; the $Tl_2Ca_{1.5}BaCu_2O_x$ or $Tl_2Ca_2Ba_2Cu_3O_x$ compound; or a compound involving substitution such as the $Nd_{1+x}Ba_{2-x}Cu_3O_x$ compounds.

48 Claims, 7 Drawing Sheets

LTS/HTS Multi-Layer Film

Stacked LTS/HTS Coil Assembly

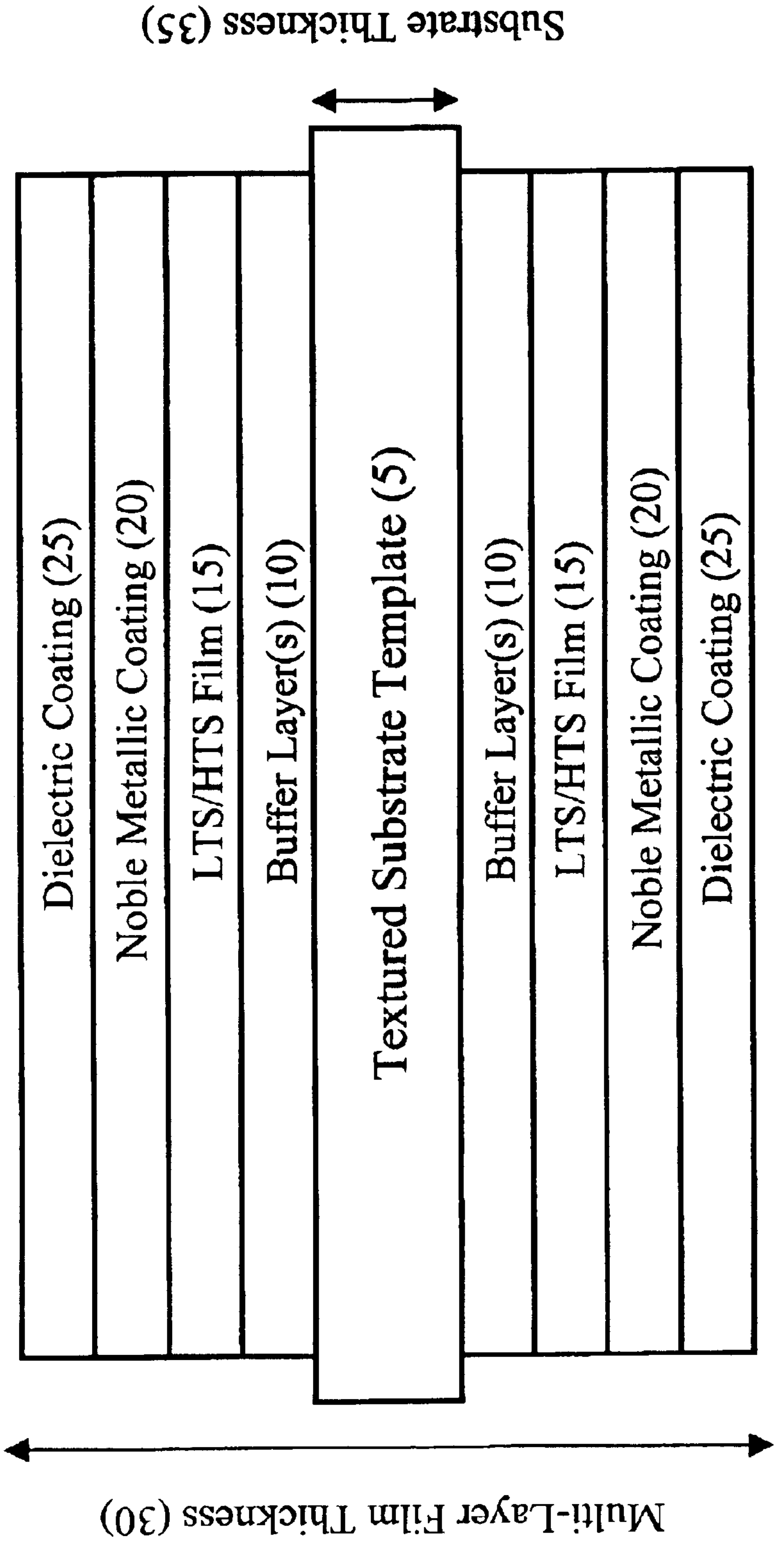
Figure 1: LTS/HTS Multi-Layer Film

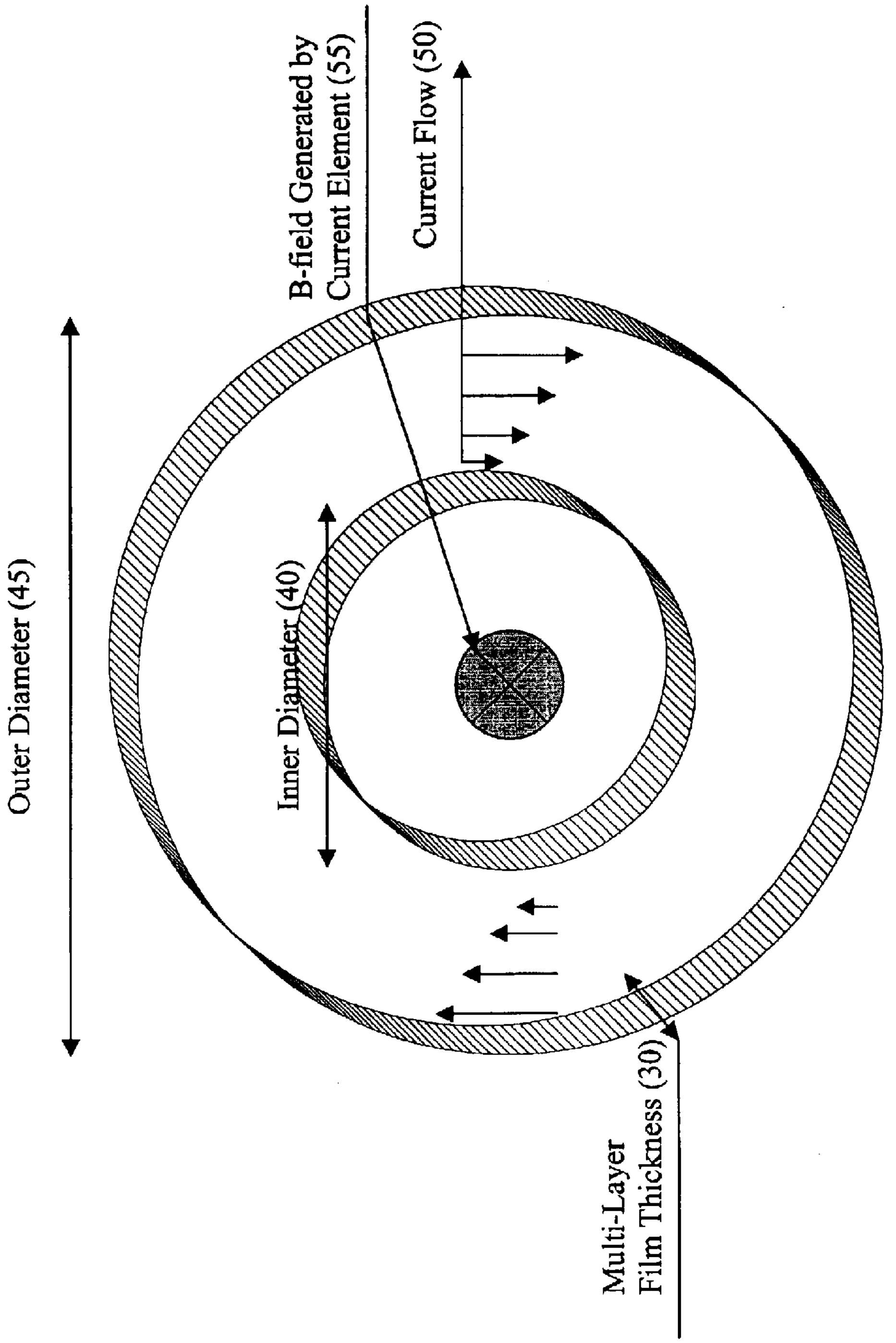
Figure 2: LTS/HTS Current Carrying Element

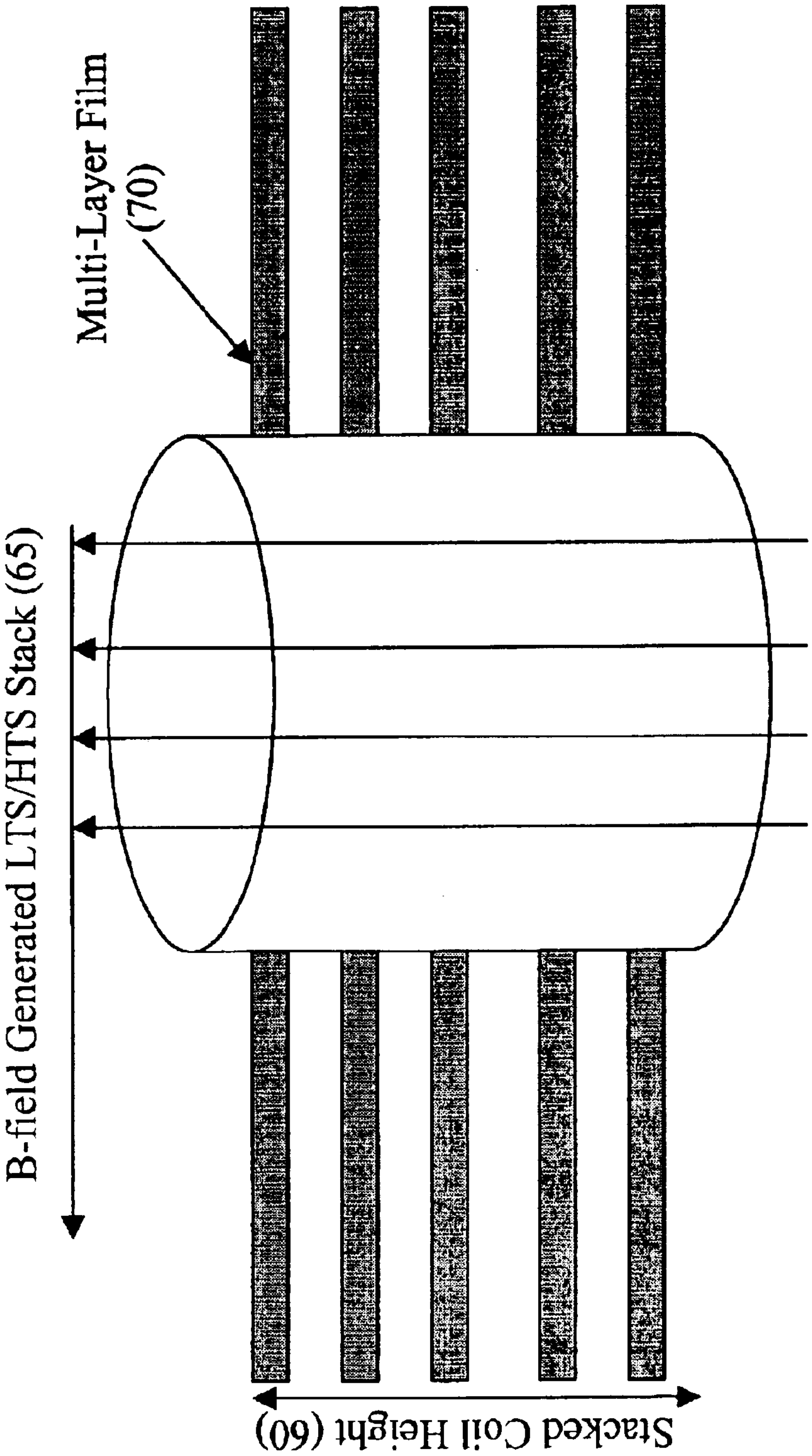
Figure 3: Stacked LTS/HTS Coil Assembly

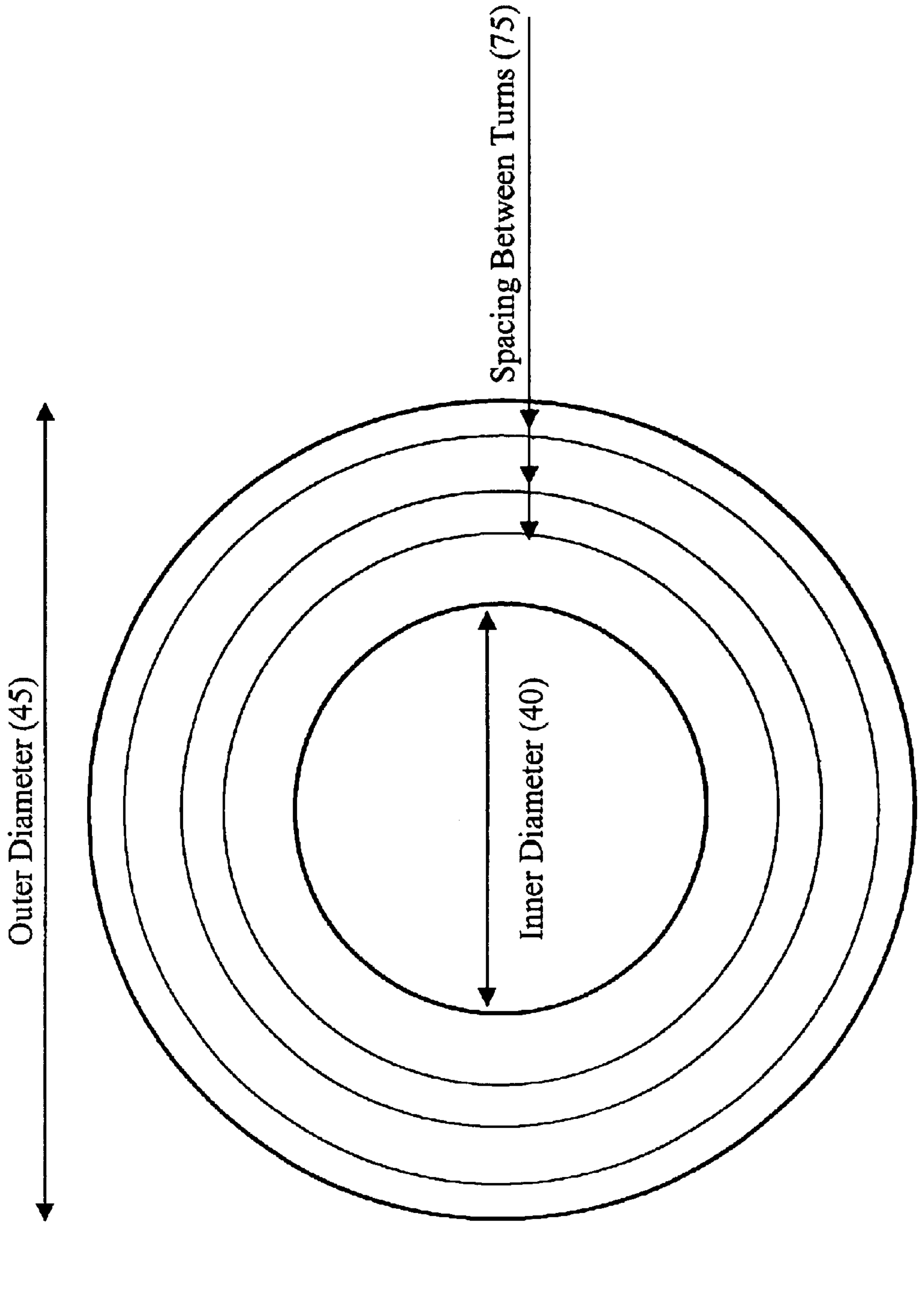
Figure 4: LTS/HTS Spiral Pancake Winding

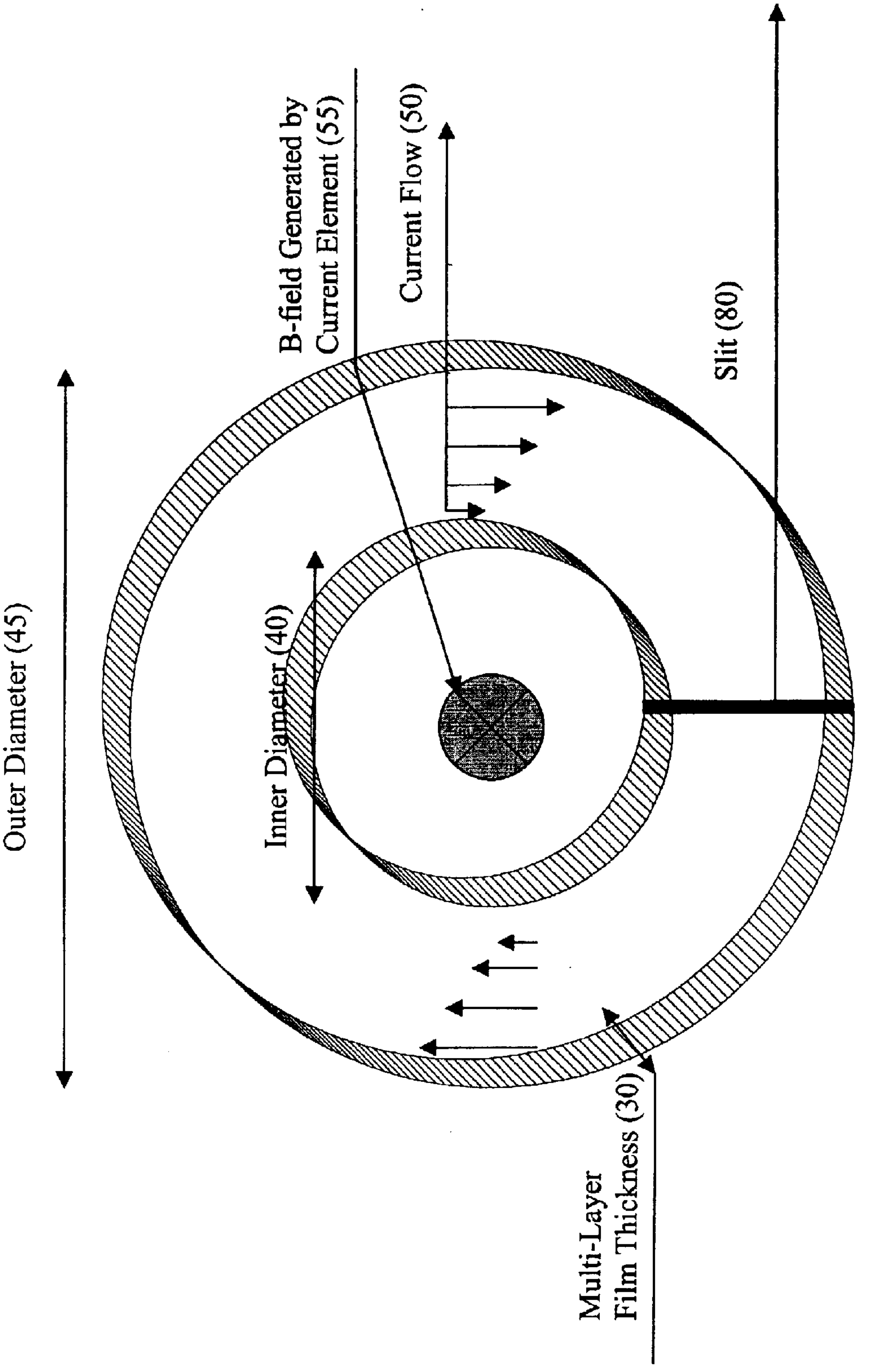
Figure 5: LTS/HTS Current Carrying Element (Bitter-coil)

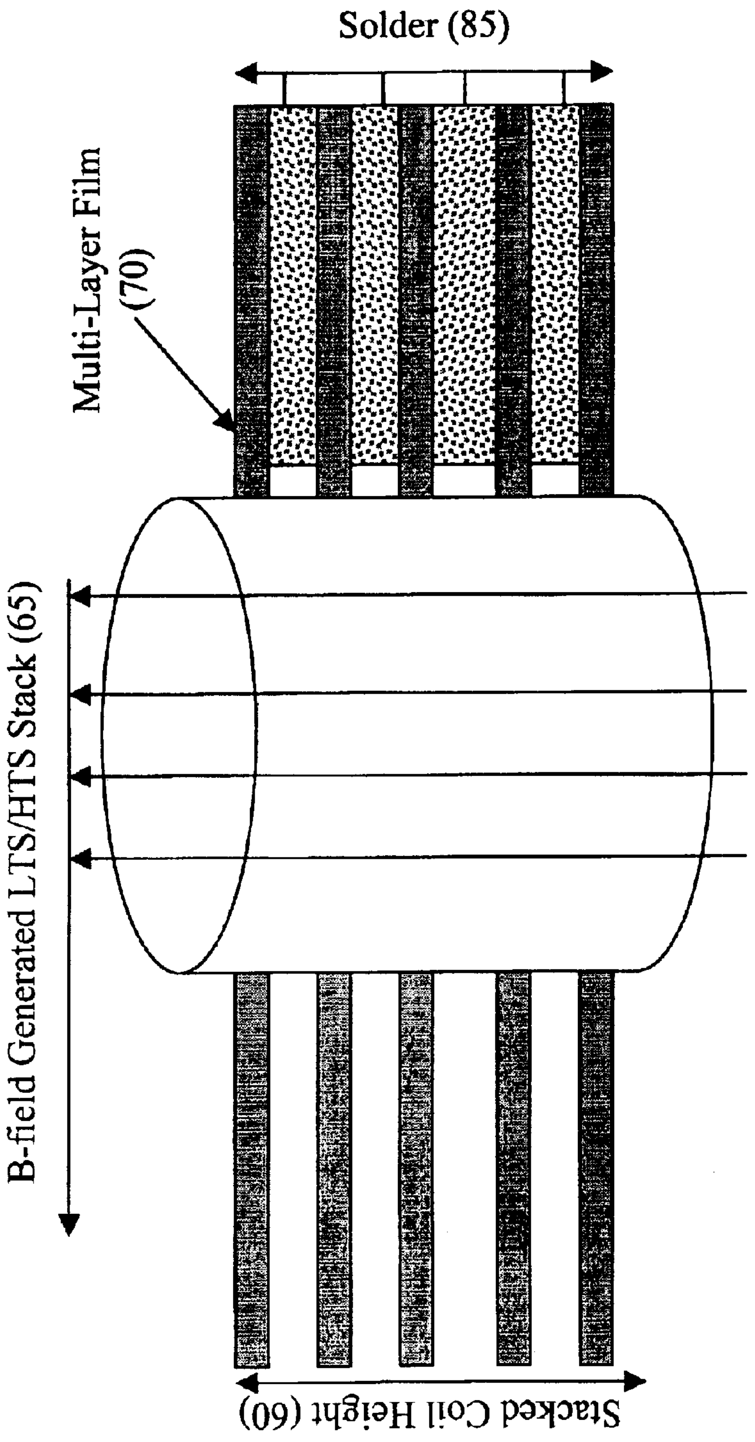
Figure 6: Stacked LTS/HTS Coil Assembly (Hybrid-Type A)

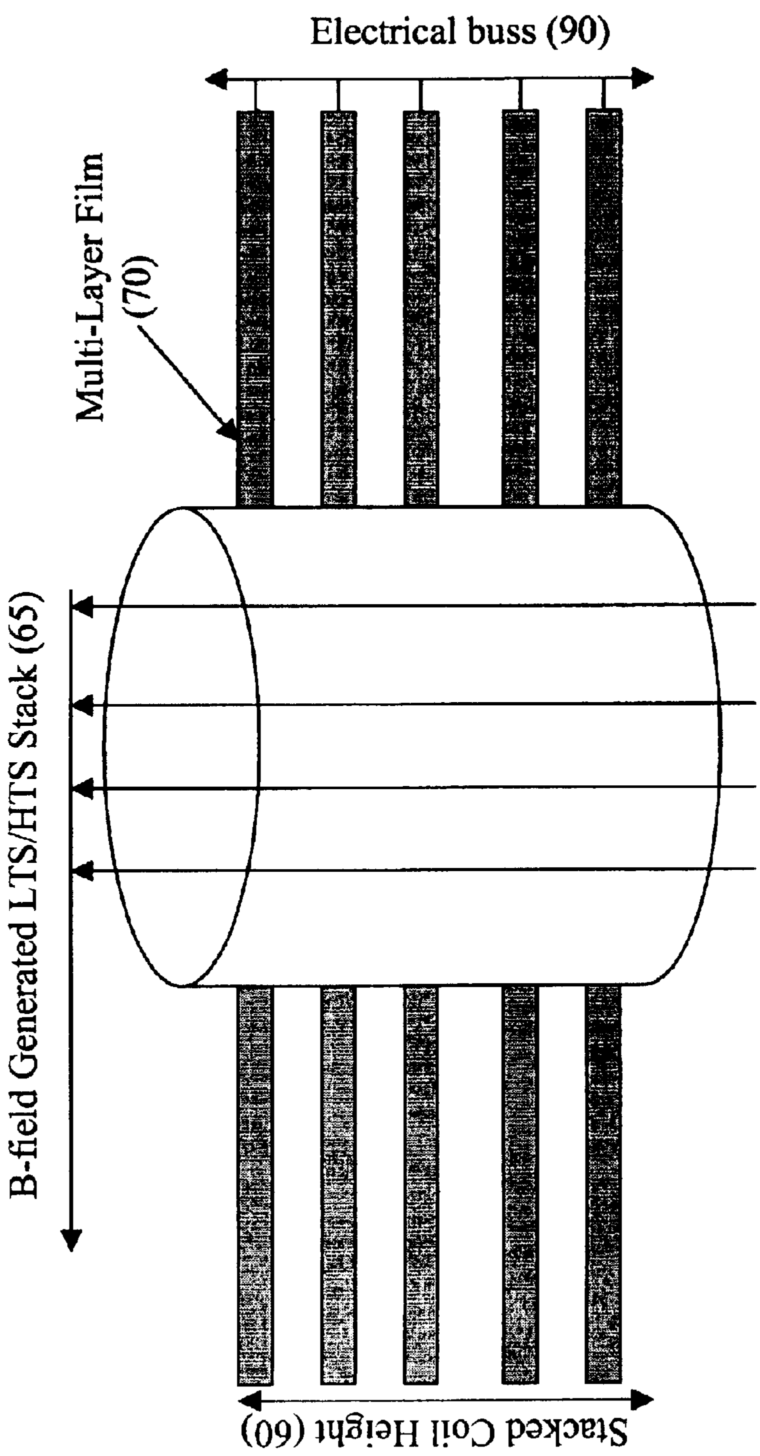
Figure 7: Stacked LTS/HTS Coil Assembly (Hybrid-Type B)

METHOD OF FORMING SUPERCONDUCTING MAGNETS USING STACKED LTS/HTS COATED CONDUCTOR

REFERENCES CITED

U.S. Patent Documents

| | | |
|---|---|---|
| 4996192 | February, 1991 | Fleischer |
| 5034373 | July, 1991 | Smith et al. |
| 5116810 | May, 1992 | Joshi et al. |
| 5231074 | July, 1993 | Cima et al. |
| 5292716 | March, 1994 | Sakai et al. |
| 5321003 | June, 1994 | Joshi et al. |
| 5525583 | June, 1996 | Aized et al. |
| 5581220 | December, 1996 | Rodenbush et al. |
| 5602080 | February, 1997 | Bednorz et al. |
| 56044735 | February, 1997 | Rodenbush |
| 5696057 | December, 1997 | McArdle |
| 5705457 | January, 1998 | Tamura et al. |
| 5849667 | December, 1998 | Murakami et al. |
| 5872081 | February, 1999 | Woolf |
| 5968877 | October, 1999 | Budai et al. |
| 5906964 | May 1999 | Chu et. al. |
| 5872080 | February 1999 | Arendt et. al. |
| 5972847 | October 1999 | Feenstra et. al |

Technical Literature

Parent Case Text

This is a patent application based upon provisional patent application No. 60/370,299.

FIELD OF THE INVENTION

The present invention relates to low temperature and high temperature superconducting materials, and more specifically, to magnets and coils formed by stacked films of superconducting materials with high critical magnetic fields and high critical current density.

BACKGROUND

General

The phenomenon of superconductivity was discovered in 1908 by Dutch Physicist Kamberlign Onnes, while studying the electrical resistance properties of pure mercury at very low temperatures. A superconducting material is one that when cooled below its critical transition temperature ($T_c$) will lose all it measurable electrical resistance. In 1933, Meissner and Oschenfield discovered that superconductors not only have zero electrical resistance, but also behave like perfect diamagnets. Superconductors are classified into two categories depending upon their magnetization properties. In an applied magnetic field, Type-I superconductors undergo a reversible thermodynamic transition from the perfectly diamagnetic superconducting state to the normal resistive state. Type II superconductors undergo two irreversible thermodynamic transitions. The first occurs at a lower critical field $H_{c1}$, and is a transition from a perfectly diamagnetic superconducting state to a "mixed" or vortex state. The second occurs at an upper critical field $H_{c2}$, and is a transition from the mixed state to the resistive normal state. In the mixed state, quantized units of magnetic field known as fluxoids are allowed to penetrate the superconducting material, while the bulk material maintains its diamagnetism. When a superconducting material is in its mixed state with fluxoids penetrating the material and a transport current is passed through the material, a Lorentz force is developed between the fluxoid and the transport current. If the fluxoid in not "pinned" to the superconducting material then it will move under this Lorentz force causing unwanted dissipation. A key to fabricating a practical superconducting is to have the "pinning" force large enough to withstand the Lorentz force from significant current flow. There are several known methods to increase pinning forces in superconductors each pertaining to the introduction of defects into the materials. Some known methods include physical defects, chemical defects, irradiation, etc, and can be found in prior artwork: U.S. Pat. No. 4,996,192 by Fleisher et al., 2) U.S. Pat. No. 5,034,373 by Smith et al., and U.S. Pat. No. 5,292,716 by Saki et al.

For any superconducting material there is a maximum or critical current density ($J_c$) that the material is able to conduct, a maximum or critical magnetic field ($B_c$) that can be applied, and a maximum or critical temperature ($T_c$) that the material can experience, without developing resistance. These three critical parameters of a superconductor are all interrelated and each play a crucial role in developing a practical material that can be used in real world applications. For example, in an externally applied magnetic field (H), the critical current density $J_c$ (T, H) of a superconductor will decrease with increasing applied field. Similarly, the critical current density $J_c$ (T, H) will decrease with increasing temperature up to the transition temperature $T_c$, where the material will revert back to its normal state.

High Temperature Superconductors and Low Temperature Superconductors

Until the 1986, all known superconducting materials had critical transition temperatures below ~23 K. This class of superconductors is commonly referred to as Low Temperature Superconductors (LTS) and typically consist of certain metallic or inter-metallic compounds (e.g. Nb, Va, Hg, Pb, NbTi, $Nb_3Sn$, $Nb_3Al$, $Nb_3Ge$, etc.). In 1986, a new class of materials based upon oxide superconductors was discovered. This class of materials had significantly higher transition temperatures. They are commonly referred to as High Temperatures Superconductor (HTS) with some examples including Re—Ba—CuO, Bi—Sr—Ca—Cu—O, (Bi, Pb)—Sr—Ca—Cu—O, Tl—Ba—Ca—Cu—O, and Hg—Sr—Ca—Cu—O.

Coated Conductors

Oxide based HTS materials tend to have strong spatial anisotropic critical current and critical magnetic fields, while most of the practical metallic/inter-metallic LTS materials tend to have isotropic critical current and critical magnetic field properties. The existence of this strong anisotropy in HTS materials has led the development of very specific fabrication methods, including the second generation coated conductors, which form the basic current carrying element of one embodiment of this invention. Second generation coated conductors use external means (i.e. not natural crystal structure) to introduce texturing to a substrate template. Films of non-superconducting buffer layers and superconducting layers are deposited in a highly controlled temperature and pressure environment onto this textured substrate template for the specific purpose of subsequently growing HTS films with a high degree of in-plane crystal orientation. There are several known methods used to fabricate second generation HTS coated conductor including: rolling assisted bi-axial textures substrates (RABiTS), ion assisted beam deposition (IBAD), inclined substrate deposition (ISD), photo assisted chemical vapor deposition (PACVD), etc.

Until 1996, most HTS films were fabricated using traditional thick and thin film techniques for use in high frequency electronic device applications. Typical thick film techniques include sol-gel, dip coating, spin coating, etc. Typical thin film techniques include rf/dc sputtering, co-evaporation, CCVD, CVD, PVD, laser ablation, etc. Using these known film deposition techniques, very high quality HTS films with $J_c>10^6$ A/cm$^2$ (77 K, self-field) were fabricated (see for example U.S. Pat. No. 5,231,074 by Cima et al). The primary reason for this success was that the HTS films were deposited on single crystal substrates that possessed a "natural" textured crystal structure orientation. Some typical single crystal substrates that have been used successfully to deposit texture HTS films are: sapphire ($Al_2O_3$), magnesium oxide (MgO), lanthanum aluminate ($LaAlO_3$), strontium titinate ($SrTiO_3$), as well as several others. The key to high quality HTS films once again being this natural highly oriented crystal structure template. By depositing the HTS films on highly oriented crystalline substrate templates, the HTS crystals themselves could grow in a highly textured format. With this high degree of crystal texture, HTS films will carry in excess of $>10^6$ A/cm$^2$ at 77K, self-field. When HTS crystals are randomly aligned i.e. polycrystalline, they will have extremely low critical current densities. Low critical current densities are not useful in most real world device applications. For example, when HTS material is deposited on polycrystalline metallic substrates (e.g. Ag, Ni, or Ni alloy), the result is a very poor quality HTS film with very low $J_c$'s. Although high quality, high $J_c$ HTS films could be grown quite readily on rigid crystalline substrates for use in electronic device applications (e.g. cavities, high frequency filters, mixers, etc.), they could not be fabricated into long lengths, which are necessary for most electromagnet applications (e.g. motors, generators, magnets, transformers, cables, superconducting magnetic energy storage-SMES, Fault Current Limiters-FCL's etc.).

In 1996, researchers began to introduce thick/thin film deposition methods for fabricating long length coated conductors on flat (polycrystalline) metallic substrates. The metal of choice was typically hastelloy, Ni or one of its alloys, because of its ability to tolerate the high reaction temperature (>700° C.) necessary for HTS phase formation, yet remain mostly chemically inert. Typically, metals have a polycrystalline order and directly depositing HTS materials on them would result in poor quality, low $J_c$ films. The key to fabricating high quality, high $J_c$ material on polycrystalline metallic substrates was the imparting of an "external" texturing means to either the template itself (e.g. RABiTS) or imparting a texturing means by the deposition process itself (e.g. IBAD, ISD, PACVD). Several of the known methods for imparting texture to the HTS materials (IBAD, RABiTS, ISD, PACVD), are known to produce high quality, high $J_c$ coated conductor. These external texturing techniques can be found in the prior artwork of: 1) Budai et al. (U.S. Pat. No. 5,968,877→October 1999), 2) Chu et al. (U.S. Pat. No. 5,906,964→May 1999), 3) Arendt et al. (U.S. Pat. No. 5,872,080→February 1999), and 4) Feenstra et al. (U.S. Pat. No. 5,972,847→October 1999. It is the use of the high quality, high $J_c$ coated conductor that form the basic current carrying element of this device.

Potential Applications

Potential commercial and military applications of this novel stacked LTS/HTS magnet technology include: active denial systems for non-lethal standoff weapons, high-field insert coils for >1 G Hz NMR applications, laboratory-scale research magnets, magnetic bearings for flywheel energy storage and magnetic levitation, high power motor/generators, transformers, and inductive fault current limiters.

SUMMARY OF THE INVENTION

Current Carrying Element

In this embodiment, common to both the Bitter type coil arrangement and the trapped flux coil arrangement is the basic current carrying element. The basic current carrying element of this embodiment consists of an LTS/HTS coated conductor film fabricated using one of the known thick or thin film techniques. If the current carrying element is specifically an HTS coated conductor, then it must include an external texturing techniques (RABiTS, IBAD, ISD, PACVD, etc.). The current carrying element may use a non-superconducting buffer layer or layers between the metallic template and the LTS/HTS film to promote textured grain alignment, better coefficient of thermal expansion matching, and better crystal lattice matching of the LTS/HTS film (see for example U.S. Pat. No. 5,602,080 by Bednorz et al.). Typical non-superconducting buffer layers include: $CeO_2$, $Gd_2O_3$, $Y_2O_3$, YSZ, MgO, $Re_2O_3$, ReZrO, $SiN_4$, $LaMnO_3$ (LMO), $La_2Zr_2O_7$ (LZO) Pt, Ag, etc. On top of the superconducting layer, a noble metallic coating (e.g. Cu, Ag, Al, Au, In) is deposited using one of the known thick/thin film deposition techniques (sputtering, evaporation, dip coating, spin coating, etc.). The noble metallic coating is used to provide electric and thermal stability during superconducting operation, and provides additional protection by reducing voltage stress, thermal runaway, and low electrical resistance by-pass, in the event that the superconducting material returns to a resistive state. The thickness of the noble metallic coating will vary according to the application, but typically will be ~1–10 microns. A low melting point metal solder such as indium (In or In-alloy) may also be included as a cap layer in the Bitter-coil or hybrid coil arrangement to reduce the splice resistance. On top of the noble metallic coating is an additional insulating coating. The insulating coating serves two purposes. First, it electrically isolates one layer in the stack of conductors from the other. Second, it provides an additional protective coating to keep the film from getting damaged or degrading as a result of exposure to the environment. The thickness of the dielectric insulating coating will vary according to the application, but typically will be <1–10 microns. The non-superconducting layers consisting of the noble metallic coating and the electrical insulator are sometime referred to as "cap" layers (see FIG. 1). The entire multi-layer film (i.e. coated conductor) make up the basic current carrying element of this invention.

Stacking of Current Carrying Elements

In this embodiment, once the basic current carrying element (i.e. multi-layer film) has been fabricated using one of the known thick/thin film deposition techniques with one of the known external texturing techniques, the multi-layer films are then stacked together to form a coil monolith assembly. Different stacking methods are possible to form the final coils. Bitter coils, trapped field coils, and hybrid coils can be fabricated using three methods of LTS/HTS film stacking: a) pancake style stacking, b) layered style stacking, and c) a combination of both pancakes and layered stacking of the films of LTS/HTS coated conductor. Either winding method can useful for a particular application. The prior artwork U.S. Pat. No. 5,581,220 or U.S. Pat. No. 5,604,473 by Rodenbusch et al. teaches pancake winding for HTS wire-based (not stacked multi-layer film) coils.

The strength of the magnetic field is determined by several factors including: a) the number of current carrying elements that comprise the stack, b) the thickness of the superconducting coating, c) single-side versus double sided coating, d) the critical current $I_c$ (T, B) of the LTS/HTS coating, e) the number of turns per individual current carrying element (pancake style winding only), f) the geometry of the stack (i.e. inner diameter, outer diameter, and height), and g) the inclusion and placement of ferromagnetic material. Further refinement and adjustment to the magnetic field of a HTS wire-wound (not stacked multi-layer film) coil is found in prior artwork U.S. Pat. No. 5,525,583 by Aized.

Mechanical Structure

In this embodiment, the Bitter-coil arrangement, the trapped field coil arrangement, or the hybrid coil arrangement may require a rigid external structure to ensure its mechanical integrity during operation. If designed appropriately, the mechanical structure can serve five useful purposes. First, during the stacking and assembling process itself it can serve as a precision alignment fixture allowing for accurate and reliable coil dimension during fabrication. Second, it can be used to support the stacked coil's hoop and axial compression forces that result during magnet energization. Third, it can be used to support the coil stress and movement that result upon thermal cycling of the coil from room temperature to its operating temperature. Fourth, strategic placement of ferromagnetic material (iron, nickel, cobalt, or appropriate alloys) integral to the mechanical support or the actual support structure itself, could be used to enhance the magnetic field at the center of the stacked coil, change the magnetic inductance/reluctance of the circuit, and/or reduce the stray magnetic field surrounding the stacked coil assembly. Finally, as with any superconducting coil it will need to be cooled below its transition temperature ($T_c$) to its operating temperature. The stacked superconducting coil assembly may be either conductively cooled (i.e. without the use of cryogens) or cooled with the use of cryogens (solid or liquid). In either case, the rigid mechanical structure that supports the stacked coil assembly can serve an additional function by providing a highly thermally conductive path and/or cooling channels in which a cryogen (liquid or gaseous) can pass. Cooling channels on the LTS/HTS film may also be required for cooling. The shape, size, density, and placement of the cooling channels can be determined by the appropriate mechanical and thermal analysis.

Bitter-Coil

In one aspect, this invention relates to the fabrication of superconducting "Bitter type" coils using stacked films of LTS/HTS coated conductor. In a Bitter type coil arrangement, the basic current carrying elements have a slit that extends from inner diameter (ID) to the outer diameter (OD). The slits of the flexible metallic substrates are bent out of plane and assembled so that adjacent current carrying elements are interleaved from one layer to the next. This interleaving of conductors provides a continuous electrical current path from the top of the coil to the bottom. On a Bitter type coil, a small region of the noble metallic coating or superconducting material itself is left exposed, i.e. not covered by the electrical insulator. The multi-layer films (described above) are then stacked one on top of the other, such that all of the electrically insulating portions are in perfect linear and/or angular alignment and all of the exposed metallic or superconducting regions are in perfect linear and/or angular alignment. Since all of the exposed metallic or superconducting regions in the coated conductor stack overlap one another and are interleaved, a continuous electrical current path is now formed from the top of the stack to the bottom, hence making a continuous coil. Current leads are then attached at the coil ends and powered by an external source. As the current flows in an archimedian spiral throughout the coil stack, it generates a magnetic field. The disadvantage of a Bitter type coil arrangement is the existence of an electrical junction/splice between the layers. Depending upon how the junction/splice is fabricated, it will have an electrical resistance associated with it. In order to make the device useful for real world applications, the electrical resistance and resulting Joule heating will have to be minimized. There are several known methods on how to reduce the electrical contact resistance between metallic or superconducting layers including: soldering, post annealing in non-oxidizing environments, increasing contact pressure, etc. (see for example U.S. Pat. No. 5,116,810 and U.S. Pat. No. 5,321,003 by Joshi et. al).

Advantages of Bitter-Coil Configuration

For the invention, the Bitter-type coil configuration has the advantage that it can be powered via an external current source to arbitrary current levels as long as the current remains below the $I_c$ (T, B) of the coated conductor. Being able to operate as an electromagnet opens up several potential market opportunities increasing the commercial viability of the invention. Another major advantage of the invention over traditional (1-cm wide) "tape type" technology is its relative wide conductor width. The "actual" conductor width for the film-disk is calculated as the outer radius (OR) minus the inner radius (IR). This wide conductor width will allow for very high current carrying capability. Double-sided coatings will further increase the current carrying capacity of the device. In magnet design and fabrication, a high operating current is advantageous in many dc and pulsed applications because it correspondingly leads to a lower coil inductance for the equivalent stored energy/B-field. For very high ac-loss applications, the wide conductor width will most likely be undesirable. Presently, there is on-going research investigating the use of laser patterning on HTS tape to form thin narrow channels in order to fabricate filament-like conductors. Filament like conductors with correspondingly small filament diameters will have lower hysteretic loss during ac and pulsed operation. If successful, it may be possible to implement this laser patterning technology to minimize the hysteric losses in the stacked film coil. In addition, photolithography has been successfully applied to the fabrication of LTS/HTS thin films used in electronic device fabrication (e.g. filters, logic devices, mixers, etc.). It is conceivable to implement photolithography techniques for the formation of small filaments in the stacked film invention by Rey. Once again, small filament diameters may be advantageous in ac applications for the reduction of hysteretic loss.

Disadvantages of Bitter-Coils: Splice Resistance

As with the conventional copper (resistive) Bitter-coils, the invention does have disadvantages in terms of heat generation. The key to a successful Bitter-style magnet is fabrication of low contact resistance splice joints. Although the film is superconducting in the dc state, hence no tremendous heat generation, still this type of coil does possess several hundred normal metal-to-superconductor splices. In terms of device operation the feasibility issues remains, will the heat generated by the normal metal/superconducting splices exceed the available cooling capacity of the device? The answer to this question depends upon four parameters: a) the magnitude of the contact splice resistance and the amount of contact splice area between the LTS/HTS film and the normal metal, b) the type of cooling available in the conductor winding (i.e. cryocooler or bath cooling), c) the operating current of the device (at operating temperature and B-field), and d) the height of the stacked LTS/HTS films (hence the total number of splices). Therefore, once the first three parameters have been fixed by the magnet design, this ultimately dictates the maximum acceptable height of the stack.

Methods for Low Contact Resistance Splices

Contact resistance values reported in the literature can vary by several orders depending upon the splice joint fabrication method. The lowest noble metal to HTS contact resistances reported are <4×$10^{-10}$ Ω-$cm^2$, while the highest are typically ~$10^{-5}$ Ω-$cm^2$. Initial calculations indicate that for most of the proposed applications (i.e. active denial standoff weapons, motors/generators, FCL's, high field insert coils, etc.), contact resistances in general need to be <$10^{-8}$ Ω-$cm^2$. There are two known reliable and reproducible methods to fabricate contact resistance joints of <$10^{-8}$ Ω-$cm^2$ on Re—Ba—Cu—O materials. The first is the "in-situ" deposition of a noble metal directly onto the HTS surface prior to cool-down and subsequent exposure to atmosphere. This prevents a Ba-rich oxide layer developing between the noble metal electrode and the HTS material. Using this proven method, reproducible contact resistances <$10^{-8}$ Ω-$cm^2$ can be fabricated. For the proposed "in-situ" film-disk fabrication method, the application of a noble metal proceeds naturally from the "semiconductor-type" fabrication process.

If the Ba-rich oxide layer is allowed to develop between the HTS material and the noble metal electrode, the contact resistance will significantly degrade and end up in the range closer to ~$10^{-5}$ Ω-$cm^2$. This will be unacceptable for most device applications. The alternative method for low contact resistance fabrication comes after the HTS material surface layer has been allowed to cool-down to room temperature and exposed to the atmosphere. If the Ba-rich oxide layer has been allowed to grow, it needs to be removed prior to deposition of the noble metal electrode. This can be accomplished by sputter etching the HTS surface and subsequently depositing the noble metal electrode onto the newly etched surface. Subsequent annealing in an $O_2$ rich atmosphere will further lower the contact resistance.

Trapped or Induced Magnetic Field Coil

In one aspect, this invention relates to the fabrication of superconducting "trapped field" or "induced field" coils using stacked films of LTS/HTS coated conductor. Trapped field coils operate on a different principle than Bitter-coils. In a trapped field magnet consisting of a stacked coil assembly, the multi-layer film, is not electrically connected in series to its adjacent layers, as is in the Bitter type case. In a trapped field magnet, single or double sided coatings are possible. Double sided coatings offer increased winding current density, but are more difficult to fabricate. In general, the magnetic field is produced by "inducing" a magnetic field in the superconducting material with an externally applied field. In the proposed invention by Rey, each current carrying element (multi-layer film) when exposed to an external "induced" field will generate an associated magnetic field. The total magnetic field generated by the stacked is determined by the number of films that comprise the stack. Once the external applied field is removed the trapped field will begin to decay over time. The decay rate is determined by the time constant, which is calculated by the inductance (L) divided by the resistance (R) of the coil. The geometry and the presence of magnetic permeable material determine the inductance of the coil. The two primary mechanisms (there are several others) that control the resistance in the superconductor are the index loss (n-value) and a thermally activated process known as flux creep, which tends to be logarithmic with time. Index loss in a superconductor tends to be controlled by the thermal and mechanical processing of the material where as flux creep is most strongly influenced by flux pinning and the operating temperature. The key to a successful trapped field LTS/HTS stacked coated conductor coil is to minimize the index loss (n-value) and maximize the pinning forces. This will decrease the magnetic field decay rate of the coil.

Advantages of the Induced-Field Coil

There are several practical advantages of using stacked coated conductor films over bulk Re—Ba—Cu—O crystals. First and most important, the $J_c$'s of Re—Ba—Cu—O coated conductor using RABiTS/IBAD technology are over 40 times higher (~4–6×$10^6$ A/$cm^2$ at 77 K) than compared with the best bulk Re—Ba—Cu—O bulk crystals (~1–2×$10^5$ A/$cm^2$ at 77 K). Double-sided coating of the film-disks will further increase the differences in $I_c$, enhancing applications requiring high current/low inductance. Second, significantly larger area film-disks up to 10–12 inches in diameter are routinely fabricated using low-cost, high-volume semi-conductor type fabrication methods. This opens up the market for more potential device applications. Finally, the coated conductors are fabricated on flexible/pliable hastelloy, Ni and Ni-alloy substrates, not weak, brittle, hard-to-handle ceramic crystals. In fact, the new Ni-3% W or Ni-6% Cr alloyed substrates are even stronger and provide an even more durable fabrication platform.

Another practical advantage of the induced-field type coated conductor magnet is that it contains no splices and is quite easily fabricated. Without splice contacts between layers, the heat generated during operation is significantly reduced. The primary heating mechanism in steady-state operation is "index or n-value" loss. With n-values in the Re—Ba—Cu—O materials >30, associated heat loss in stacked film magnets is expected to be quite low.

Disadvantages of Induced/Trapped Field Coil: Permanent Magnet Arrangement

Although the induced-field type arrangement can be fabricated with relative ease, its implementation into practical applications is correspondingly limited. Unlike the Bitter-coil configuration, the induced-field magnet acts more like a permanent magnet not an electromagnet. This limits the types of devices that can use permanent magnets. Typical applications of trapped-field magnets include: magnetic bearings for HTS flywheels, inductive fault current limiters, high-field insert coils, etc.

Hybrid Coil, Type A: Combination Bitter and Trapped/Induced Field Coil

In one aspect, this invention relates to the fabrication of superconducting magnet/coil that is a "hybrid" of both a "trapped/induced field coil" and a "Bitter-type coil." The "hybrid-coil, type A" invention also uses stacked film-disks of LTS/HTS coated conductor. The "hybrid coil, type A" invention exploits the electromagnet/excitation capability of the Bitter-coil, but employs the less costly and complicated fabrication method of the trapped-field coil. The hybrid coil, type-A is fabricated using the basic current carrying element consisting of a LTS/HTS coated conductor film-disk. Multiple current carrying elements (film-disks) are once again stacked and compressed to form a monolith coil. Recall that the basic current carrying element of the Bitter-coil (i.e. an LTS/HTS film-disk) has a slit cut on one side. The hybrid arrangement does NOT possess this slit extending from the IR to the OR of the film-disk. In the hybrid coil arrangement there is no overlapping or interleaving of the conductors. Instead the current is transferred from one current carrying element to the next current carrying element through the buffer layers and the metallic substrate itself. The hybrid coil invention has both advantages and disadvantages associated with its construction and operation.

Advantages of Hybrid Coil, Type A

For this aspect of the invention, the "hybrid coil, type A" has the advantage that it can be powered via an external current source to arbitrary current levels as long as the current remains below the $I_c$ (T, B) of the coated conductor. Being able to operate as an electromagnet opens up several potential market opportunities making the invention more commercially viable. The second advantage of the hybrid coil invention is that it is fabricated and assembled using the induced/trapped field coil method. The induced/trapped field coil does not have a slit extending from the IR to the OR. Therefore, there is no overlapping or interleaving of the film-disks required during fabrication. This fabrication method is far less complicated and more cost effective.

Disadvantages of Hybrid Coil, Type A

The "hybrid coil, type A" invention has two primary disadvantages. First, it will not work if a buffer layer is present and that buffer layer is not electrically conducting. If no buffer layer is present (e.g. LTS type film-disks) then this is a non-issue. If a buffer layer or layers are present during fabrication of the basic current carrying element (e.g. HTS film-disk), then the buffer layer must be electrically conducting for the hybrid approach. The second disadvantage of this approach is that at some point the current must pass through the normal (i.e. non-superconducting) metallic substrate, causing unwanted Joule heating. There are several substrate materials and fabrication methods that can mitigate this unwanted heating. First, noble metallic substrates such as silver and copper have been used to fabricate LTS and most recently HTS coated conductor. At cryogenic temperatures (e.g. 4–80 K) necessary for superconducting operation, the electrical resistivity of pure noble metals (e.g. copper, silver, aluminum) is quite low, thus if the metallic substrate is made thin enough, the resultant Joule heating can be minimized to acceptable levels. Even for the case where the flexible metallic substrate does not consist of a noble metallic metal (e.g. stainless steel, hastelloy, Ni, or Ni-alloy, etc), there is ample evidence from commercial Bismuth-oxide based superconducting wire that demonstrates the viability of this approach. If the substrate material can be made thin enough then the amount of Joule heating can be acceptable in many applications. For example, superconducting silver-clad bismuth-oxide powder-in-tube-tape is often fabricated with stainless steel laminations on each side to provide structural support. This laminated tape forms a composite conductor that is sold commercially. The electrical current carried by this composite superconducting bismuth-oxide wire sandwiched between stainless steel laminations must eventually pass through the stainless steel lamination. In applications wound with pancakes style windings, there can be several hundred of these types of normal metal splice connections within the coil.

Hybrid Coil, Type B: Trapped/Induced Field Coil with Segment Excitation

In one aspect, this invention relates to the fabrication of superconducting magnet/coil that is a "hybrid" of both a "trapped/induced field coil" and a "Bitter-type coil." The "hybrid-coil, type B" invention also uses stacked film-disks of LTS/HTS coated conductor. The hybrid coil, type-B invention exploits the electromagnet/excitation capability of the Bitter-coil, but employs the less costly and complicated fabrication method of the trapped-field coil. The hybrid coil, type-B is fabricated using the basic current carrying element consisting of a LTS/HTS coated conductor film-disk. Multiple current carrying elements (film-disks) are once again stacked and compressed to form a monolith coil. In the hybrid coil, type B an individual current carrying element (i.e. LTS/HTS film-disk) is individually energized with either an external current source or an induced magnetic field. This can be readily accomplished by fabricating each current carrying element with a positive and negative terminal for electrical connection to an external power source. Each current carrying element can be energized as necessary to generate the desired magnetic field. The hybrid coil, type B has both advantages and disadvantages associated with its construction and operation.

Advantages of Hybrid Coil, Type B

The hybrid coil, type B has two primary advantages associated with it. First, it employs the less complicated and costly trapped/induced field fabrication method. It does not require a slit or interleaving of adjacent current carrying elements. Second, the electrical current does not have to pass through the buffer layers or the metallic substrate, minimizing the Joule heat generated.

Disadvantages of Hybrid Coil, Type B

The primary disadvantage of the hybrid coil, type B is the complicated excitation/energization feature of the coil. Each individual current carrying element (or groups of elements) must be excited separately. This adds unwanted complexity and cost to the device. In addition, the electrical bus which carries the power to the current carrying element (or elements) must be precisely fabricated with the correct impedance to insure uniform current distribution in each of the elements energized in order to insure magnetic field homogeneity. If an inhomogeneous magnetic field is desired (e.g. magnetic field gradient) the bus impedance can be designed appropriately to obtain the required gradient.

Possible Film-Disk Fabrication Method

Whether fabricating the Bitter-type, induced-field type coil, or the hybrid type (A or B) coil the proposed film-disk fabrication method is similar. One possible HTS film-disk fabrication method is as follows. A Ni/Ni-alloy or equivalent substrate is cleaned, polished, annealed and textured using the established RABiTS/IBAD fabrication technology. Multiple textured Ni/Ni-alloy film-disks are loaded onto a sample holder platform, which is placed in a vacuum/non-vacuum deposition chamber. The buffer layer/superconductor architecture is simultaneously deposited on all of the coated conductor substrates in a controlled temperature, pressure and gas species environment. While still "in-situ" a Ag, Cu or Au noble metallic cap layer is simultaneously deposited on all the samples followed by a thin layer of In or In-alloy solder. The samples are then cooled and removed from the vacuum/non-vacuum deposition chamber. If increased current carrying capacity is desired, the substrates are flipped over and the process is repeated to obtain a double-sided coating. The film-disks are then spray coated with a cryogenic epoxy adhesive and stacked one-by-one in a precision stacking form (see also mechanical structure). The stacked film-disks are then cured to form a single monolith coil.

For the Bitter type coil arrangement, three additional steps need to be introduced. First, after the preparation of the Ni/Ni-alloy substrate using the RABiTS/IBAD formulation, a slit from the OR to the IR needs to be made to the film-disk. The slit can be made either prior to or after the film deposition process. The slit is necessary so that the current carrying elements can be interleaved. Second, after buffer layer/HTS/noble metallic film deposition and prior to the insulation coating, a low melting temperature In/In-alloy solder spray/strip is applied to the exposed (i.e. un-insulated) portion of the noble metallic cap layer. The solder coating can either be deposited "in-situ" or "ex-situ" depending upon cost and convenience. Finally, the stacking of the film-disks is slightly different than the induced field coil, which are stacked one on top of the other. Instead, they are interleaved so that the exposed (un-insulated) metallic portion of the film-disk is in intimate contact with the layer above. The stacked film is then heated to the curing temperature of the epoxy, which simultaneously allows the In solder to melt/flow and form its splice junction. In some limited applications, the film stack may also be compressed using the external mechanical support structure to form the splice contact between the disks, thus eliminating the need for solder. The contact resistance of the pressed contact may be low enough for some applications depending upon the operating current level and the heat removal mechanism (e.g. pool boiling liquids or solid cryogens).

ADVANTAGES

The invention by Rey has several advantages over any of the existing prior art work The invention by Rey takes advantage of the all the recent progress that has been made concerning the fabrication of second generation HTS coated conductor to fabricate stacked coil assemblies.

Crystal Substrates vs. Coated Conductor Metallic Substrates

HTS coils can be formed by stacking high quality, high $J_c$ superconducting films that have been deposited on rigid crystalline substrates. Of all of the rigid crystalline substrates used in HTS film fabrication for electrical device application, the only viable candidate for coil/magnet applications to date is sapphire ($Al_2O_3$). The remaining rigid crystalline substrates are typically too weak and too brittle for practical magnet applications. HTS films grown on sapphire not only have $J_c$'s in excess of $10^6$ A/cm$^2$ (77 K, self-field), but the sapphire itself is quite strong possessing a tensile modulus/strength in excess of 400 GPa/4 GPa. A strong substrate is required in order to support the hoop and axial compression forces experienced by the coil winding during thermal cycling and coil energization. There are three severe limitations of using rigid crystal wafers such as sapphire. First, rigid crystalline substrates such as sapphire cannot be used in the Bitter-type coil arrangement where the inter-leaving (i.e. flexibility) of the current-carrying element is required. Second, because the rigid crystalline substrate is not electrically conducting it cannot be used in the hybrid coil, type A arrangement. In the hybrid coil, type A the electrical current must pass through the substrate itself to transverse from one film-disk to the other. Finally, for the trapped-field magnet, the primary disadvantages of the rigid crystalline sapphire substrate in stacked coil applications are its thickness and cost. The problem with a thick non-superconducting substrate in a stacked coil assembly is that it essentially dilutes the "winding" current density of the coil. For example, the thinnest that a high quality single crystal sapphire wafer ~two (2) inches in diameter can be polished is ~330 microns, at a present-day cost (03/03) of about $100–200 per wafer. Although a high quality, high $J_c$ (>$10^6$ A/cm$^2$ at 77 K) HTS film can be grown on this 2 inch sapphire substrate, the actual thickness of the superconducting layer itself (e.g. Re—Ba—Cu—) is limited to typically <0.5 microns. The limitation of the HTS thickness on sapphire is due primarily to difference in the coefficient of thermal expansion (CTE) between the sapphire and the HTS film. HTS coatings thicker than ~0.5 microns result in non-textured growth, micro cracking, and hence poor quality HTS material. Thus, the ratio of the substrate thickness to the superconducting material thickness, it is ~660 to 1. This ratio of the substrate material relative to the actual (superconducting) current carrying portion significantly dilutes the overall winding current density, rendering most coil applications not practical or economical. The situation only worsens as the diameter of the rigid sapphire crystalline wafer increases. Three (3), four (4), and six (6) inch diameter sapphire wafers can be polished to thickness ~430, 530, and 675 microns, respectively. Meanwhile, the HTS film thickness' cannot increase beyond the stated 0.5 microns or once again poor quality, low $J_c$ material results. This means that the ratio of substrate to HTS will be 860 to 1, 1060 to 1, and 1350 to 1, further diluting the effective winding current density of the stacked coil. These are not practical or economical devices.

In this embodiment, an LTS/HTS coated conductor with its thinner, flexible, electrically conducting, textured metallic substrate replaces, the thicker, rigid, crystalline substrate. The textured metallic substrate is not only significantly thinner and more flexible making it easier to fabricate, but also substantially cheaper making the ultimate application more economically viable. Once again, the flexible metallic substrate can is the only viable option for the Bitter-type coil arrangement that requires inter-leaving of the current carrying element and the hybrid coil, type-A. In addition, high quality, high $J_c$ (>$10^6$ A/cm$^2$ at 77 K) HTS material can be grown thicker on flexible metallic substrates than on its rigid crystalline wafer counter-part because of the better CTE match. For example, high quality, high $J_c$ coated conductor fabricated with Re—Ba—Cu—O has been grown up to 1.5–2 microns thick and Tl—Ba—Ca—Cu—O has been grown up to 3 microns thick with $J_c$'s >$10^6$ A/cm$^2$ at 77 K and self-field. Typical (Ni and Ni alloy) metallic substrate thickness used in RABiTS and IBAD coated conductor fabrication range from 50 to 100 microns. At its thinnest (~50 microns), the flexible textured metallic substrate is over 6 times thinner than its rigid crystalline counter-part. For example, a Re—Ba—Cu—O layer 1.5 microns thick deposited on a 50 micron thick textured metallic substrate has a substrate to superconductor ratio of only ~33 to 1. As the diameter of the metallic substrate increases this ratio is maintained and does not increase likes its rigid crystalline counter-part.

Recently, two additional bi-axially textured metallic substrates have come into use in HTS coated conductor fabrication. The first is single crystal Ni substrate ~50 microns thick. Using this flexible highly textured material, $J_c$'s >4–6×$10^6$ A/cm$^2$ (77 K, self-field) have been obtained. Second, even thinner bi-axially textured metallic substrates have been fabricated using Ni alloys of Ni-3% W and Ni-6% Cr. Substrate thickness ~33 microns have been routinely fabricated in long lengths thus reducing the substrate to superconductor ratio to ~22 to 1. Both of these recent developments (single crystal Ni and Ni-3% W or Ni-6% Cr) would further reduce the substrate to superconductor ratio making the proposed invention by Rey even more viable.

Bulk Ceramic HTS Crystals vs. Coated Conductor Metallic Substrates

The most common method used in prior artwork to fabricate trapped field magnets is the use of bulk crystals of Re—Ba—Cu—O. In order for bulk ceramic HTS crystals to make practical trapped field magnets they must be able to carry significant amounts of current. This requires a significant amount of cost preparation of the bulk ceramic HTS crystal. The preparation and fabrication of HTS bulk ceramic crystals can be found in the prior artwork of: a) McArdel et al. b) U.S. Pat. No. 5,696,057, c) Tamura et al. U.S. Pat. No. 5,705,457, d) Murakami et al. U.S. Pat. No. 5,849,667, and e) Woolf et al. U.S. Pat. No. 5,872,081. At first glance, bulk ceramic HTS crystals may appear to have the advantage over the proposed invention using a stacked HTS coated conductor assembly in that they consist of a uniform crystal with no dilution of the winding current density from a non-superconducting substrate. As mentioned above, the non-superconducting substrate dilutes the overall current density of the trapped field magnet lowering the effectiveness of the device. Upon careful consideration, however, there are four primary advantages that the proposed stacked HTS coated conductor assembly has over the bulk ceramic HTS crystal. First, the $J_c$ of HTS coated conductor film is over an order of magnitude higher at equivalent temperatures and magnetic fields compared to bulk ceramic HTS crystals. In fact, for the single crystal Ni mentioned above, $J_c$'s of the coated conductor are >40 times larger than the best bulk ceramics. Second, bulk HTS crystals are mechanically rigid and relatively weak compared to flexible HTS coated conductor on textured metallic substrates. Making a useful device out of a rigid, weak, brittle ceramic will be more difficult and costly than fabricating a similar device out of a flexible metallic substrate. Furthermore, using rigid bulk crystals virtually eliminates the possibility of the Bitter-style electromagnet. Third, the stacked coated conductor invention by Rey is based upon the fabrication methods developed in the semi-conductor process industry, which is geared towards high volume, high throughput, high yield manufacture. This proven and established film deposition technology will make the stacked coated conductor invention more economically viable. Finally, bulk ceramic HTS crystals can only be grown in diameters up to about 2 inches. Using vacuum and non-vacuum deposition techniques developed for the semi-conducting industry several shapes and sizes >10–12 inches in diameter are possible. This opens up the possibility of a wide variety of potential commercial and military market opportunities.

Unique Advantage of Stacked-Film Coil

The invention using HTS/LTS stacked-film technology offers a unique advantage not available in previous HTS or some LTS magnet technology (e.g. $Nb_3Sn$ and $Nb_3Al$). Due to the intrinsic brittle ceramic nature of HTS wire/tape and LTS $Nb_3Sn$ and $Nb_3Al$ technology, there is an upper limit to the maximum bending strain that can be applied to the wire. For example, in state-of-the-art Bi-2223 technology the minimum bending diameter of the (stainless steel re-enforced) wire is ~50–70 mm. For $Nb_3Sn$ the minimum bending strain is ~0.2–0.3% Hence, coils cannot be fabricated with inner diameters that do not meet these minimum requirements. For YBCO coated conductor based upon 1 cm wide flat Ni tape, the minimum bend diameters appear to be comparable to Bi-2223.

While superconducting coils with diameters <70 mm represent a relatively small commercial market, none the less there are need for such coils (e.g. NMR coils and laboratory research magnets). A unique advantage of the proposed stacked film coil is that any inner diameter is possible. This is due to the thin-film fabrication method of the film-disks and the subsequent stacking process. This new possibility will open up new commercial markets not previously available in HTS and some LTS magnet technology.

Related Artwork

This invention builds upon prior artwork to culminate in an invention that is significantly superior to previous artwork. There are four technologies that are necessary to combine to compose the invention: a) superconducting trapped field magnets, b) Bitter type stacked coils, c) HTS bulk crystals, and d) HTS coated conductor.

U.S. Pat. No. 5,968,877, U.S. Pat. No. 5,906,964, U.S. Pat. No. 5,872,080 and U.S. Pat. No. 5,972,847

There are four recent patents that are cited as relevant to the proposed invention by Rey: 1) Budai et al. (U.S. Pat. No. 5,968,877→October 1999), 2) Chu et al. (U.S. Pat. No. 5,906,964→May 1999), 3) Arendt et al. (U.S. Pat. No. 5,872,080→February 1999), and 4) Feenstra et al. (U.S. Pat. No. 5,972,847→October 1999. All four of these patents deal with the deposition of HTS materials and non-superconducting buffer layers on flat metallic nickel substrates using either the PACVD, RABiTS, or IBAD deposition process for the purpose of fabricating long length coated conductor. The methods used in the patents in these patents serve as the starting point of the proposed invention by Rey. In the invention proposed by Rey, the HTS coated conductor (i.e. multi-layer film) comprises the basic current carrying element. The fundamental differences between the invention by Rey and the patents listed above are in fabrication, form and, function. U.S. Pat. No. 5,968, U.S. Pat. No. 5,906,964, U.S. Pat. No. 5,872,080, and U.S. Pat. No. 5,972,847 deal strictly with the fabrication of coated conductor for the purpose of long length wire/tape fabrication. These patents do not deal with the process of making coils themselves. The invention proposed by Rey is how to make a useful device from the HTS coated conductor. In fact to further highlight the differences, the coils fabricated with the HTS coated conductor using U.S. Pat. No. 5,968, U.S. Pat. No. 5,906,964, U.S. Pat. No. 5,872,080, and U.S. Pat. No. 5,972,847 will be wire/tape wound superconducting electromagnets. Wire/tape wound superconducting electromagnets are far more common than either Bitter-type coils or trapped field coils, which tend to be only found in research environments.

U.S. Pat. No. 5,696,057, U.S. Pat. No. 5,705,457, U.S. Pat. No. 5,849,667, and U.S. Pat. No. 5,872,081

Related to the proposed invention by Rey are the several patents pertaining to the fabrication and manufacture of bulk HTS crystals including U.S. Pat. No. 5,696,057 by McArdle et al, U.S. Pat. No. 5,705,457 by Tamura et al., U.S. Pat. No. 5,849,667 Murakami et al., and U.S. Pat. No. 5,872,081 by Wollf et al. However, these patents are quite different in their design, assembly, and function than the stacked multi-layer film of LTS/HTS coated conductor proposed by Rey.

U.S. Pat. No. 6,083,885 Weinstein Jul. 4, 2000

The closest in prior artwork to the invention by Rey is U.S. Pat. No. 6,083,885 by Weinstein. U.S. Pat. No. 6,083,885 deals directly with the fabrication of trapped field magnets made from HTS materials. However, there are four fundamental differences between this invention and that of U.S. Pat. No. 6,083,885: 1) stacked films of HTS coated conductors on flexible metallic substrates versus rigid, bulk ceramic HTS crystals, 2) the inclusion of Bitter type coil arrangements and hybrid coil types A and B arrangements versus trapped/induced field magnets only, 3) the stacked approach to coil fabrication, and 4) the specific inclusion of LTS films such as NbTi, $Nb_3Al$, $Nb_3Sn$, and the recently discovered $MgB_2$.

Textured Bulk Crystals versus Texture Thin Films

First, it is clear from the technical description that U.S. Pat. No. 6,083,885 deals almost exclusively with bulk ceramic HTS crystals and not with HTS coated conductors (see ADVANTAGES above for technical differences between bulk crystals and HTS coated conductor). All of the claims U.S. Pat. No. 6,083,885 pertain strictly to trapped field magnets fabricated from bulk ceramic HTS crystals. Nowhere in the claims of U.S. Pat. No. 6,083,855 is any reference made to magnets fabricated from stacked films or HTS coated conductor. All of the fabrication discussions contained within embodiment of U.S. Pat. No. 6,083,885 deal strictly with the fabrication and enhancement of pinning centers (with the use of a fissionable element) of bulk HTS crystals. Nowhere in the patent is the mention of HTS coated conductor, its fabrication, or means to improve HTS coated conductor current carrying properties. It is clear from all of the discussions, that U.S. Pat. No. 6,083,855 deals primarily with HTS bulk crystals.

Despite this fact U.S. Pat. No. 6,083,855 specifically does mention the use of textured superconductors in claim 1 and in the "Summary of Invention" section U.S. Pat. No. 6,083, 855 again mentions textured thick and thin superconducting films in the embodiment. However, the main difference between the proposed invention by Rey is clearly spelled out in the text itself of U.S. Pat. No. 6,083,855. Directly quoting U.S. Pat. No. 6,083,855 it clearly defines what is meant by the use of texturing;

". . . Texturing, as defined herein, includes any process of aligning microcrystals or growing larger crystals in a bulk sample, and also includes "natural" texturing that occurs when a thick film is deposited (for example, by spin coating) or a thin film is deposited by any of the known physical deposition method (for example, sputtering, evaporation, epitaxial growth) and in processed in-situ or ex-situ. Without texturing the polycrystalline HTS has very low intergrain current density . . . "

Upon careful examination of this statement from U.S. Pat. No. 6,083,855 two important points are made clear. First, the texturing defined in U.S. Pat. No. 6,083,855 refers strictly to a process of aligning the microcrystals of bulk samples and has nothing to do with HTS coated conductors. Second, when referring to textured thin or thick films it only refers to the natural texturing that is available from specific rigid single crystal substrates. It does not mention any means for fabricating HTS coated conductors using external texturing means nor does it recognize the benefit from using the thinner substrate.

Stacked Conductors

U.S. Pat. No. 6,083,855 by Weinstein uses only one (1) bulk HTS single crystal to produce its trapped field magnet. The invention proposed by Rey takes advantage of the increase in magnetic field that can be realized by stacking multiple elements together. This is not obvious to one skilled in the art because had U.S. Pat. No. 6,083,855 realized this fact, a more useful device could have been realized by stacking several layers of the bulk HTS ceramic crystal itself.

Bitter Type Coils and Hybrid Coils Type A and B

U.S. Pat. No. 6,083,855 by Weinstein deals strictly with trapped flux magnets and specifically excludes Bitter coils and the hybrid coils types A and B. Nowhere in the embodiment or claims is a Bitter type coil arrangement either expressly mentioned or even alluded to in passing reference. In fact, it is virtually impossible to fabricate a Bitter-coil or a hybrid coil, type A using a rigid, electrically insulating, bulk ceramic crystal. A Bitter coil or a hybrid coil arrangement can be advantageous because they can be powered with an external power supply by attaching current leads at either ends of the coil (or in fact any layer within the coil→see hybrid, Type B. Bitter coils and hybrid coils have disadvantages in that a splice/junction is necessary between each successive layer of the coil stack arrangement. This splice/junction will have an electrical resistance associated with it and hence dissipate Joule heat. It is the problem of the magnet designer to minimize that unwanted Joule heating.

LTS Coated Conductors

The final difference between the invention by Rey and U.S. Pat. No. 6,083,855 is the specific inclusion of LTS materials. As mentioned above, U.S. Pat. No. 6,083,855 deals strictly with trapped field magnets fabricated with bulk ceramic HTS crystals. Nowhere in the text of U.S. Pat. No. 6,083,855 is any mention of LTS materials or their use in trapped field magnets. The specific inclusion of LTS materials is not an obvious extension to one skilled in the art because bulk crystals of LTS metallic/intermetallic are extraordinarily rare, difficult and costly to fabricate, and have few real world applications. LTS films, which form the basic current carrying element of the stacked coil assembly proposed by Rey (see claim 10), are a different matter. LTS thick and thin films are easier and less costly to fabricate than their HTS counter-parts and have numerous applications in real world devices. A stacked coil assembly of LTS coated conductor (NbTi, $Nb_3Sn$, $Nb_3Al$, or $MgB_2$) for example would have many useful real world applications.

DESCRIPTION OF FIGURES

FIG. 1

FIG. 1 shows a 2-d side view of a multi-layer LTS/HTS double-sided coated conductor comprising a current carrying element. The basic current carrying element consists of a thin non-superconducting substrate (5), an optional non-superconducting buffer layer or layers (10), the LTS/HTS material (15), a noble metallic coating (20), and a dielectric coating (25). The multi-layer film has a total thickness (30). The non-superconducting substrate (35) should be as thin as possible to increase efficiency the device.

FIG. 2

FIG. 2 shows a 2-d top view of the basic current carrying element. The geometry of the current carrying element is determined by the inner diameter (40), the outer diameter (45), and the multi-layer film thickness (30). For this illustration, the current flow is clockwise (50) generating a magnetic field (55) into the page. For a trapped field magnet the current results from an induced external field. For a Bitter type coil or a hybrid coil types A and B, the current flows from one layer to the next from an external power supply. A circular (i.e. disk) coated conductor geometry is shown for illustration purposes, but square or rectangular geometries are also possible.

FIG. 3

FIG. 3 shows a 2-d side view of the "generic" stacked coil assembly (60). The stacked coil assembly is comprised of multi-layer LTS/HTS coated conductor (65), which generates a magnetic field (70) at the center of the stack. For a Bitter-type coil or a hybrid coil, type A, an electrical junction/splice exists between the layers. For a trapped field coil, no junction/splice exists between layers. For a Hybrid coil type B each individual current carrying element (or groups of elements) is powered separately.

FIG. 4

FIG. 4 shows a 2-d top view of a pancake style LTS/HTS coated conductor. In this configuration, the current carrying element geometry is determined by the inner diameter (40), the outer diameter (45), and the spacing between turns (75). Trapped field pancake style coils use concentric circles, whereas Bitter type pancake coils require an archimedian spiral with an electrical connection between adjacent layers. In this style of winding, one tries to minimize the spacing between turns to maximize the output magnetic field.

FIG. 5

FIG. 5 shows a 2-d top view of the basic current carrying element for a Bitter disk. The geometry of the current carrying element is determined by the inner diameter (40), the outer diameter (45), and the multi-layer film thickness (30). For this illustration, the current flow is clockwise (50) generating a magnetic field (55) into the page. Note the slit (80) that extends from the inner radius (IR) to the outer radius (OR). For a Bitter type coil, the flexible substrate is bent out of plane and interleaved with the adjacent film-disk to form a continuous electrical current path. Electrical connection is made at the top and bottom of the stacked coil. A circular (i.e. disk) coated conductor geometry is shown for illustration purposes, but square or rectangular geometries are also possible.

FIG. 6

FIG. 6 shows a 2-d side view of the stacked coil assembly (60) for a "Hybrid coil, Type A." The stacked coil assembly is comprised of multi-layer LTS/HTS coated conductor (65), which generates a magnetic field (70) at the center of the stack. For a Bitter-type coil or a hybrid coil, type A, an electrical junction/splice (85) exists between the layers.

FIG. 7

FIG. 7 shows a 2-d side view of the stacked coil assembly (60) for a "Hybrid coil, Type B. The stacked coil assembly is comprised of multi-layer LTS/HTS coated conductor (65), which generates a magnetic field (70) at the center of the stack. For a Hybrid coil type B each individual current carrying element (or groups of elements) is powered separately by an external buss (90).

What is claimed is:

1. A superconducting electromagnetic coil device consisting of:

multiple superconducting multilayer films, each having:

a thin, metallic, flexible, non-superconducting substrate template, and a precursor high or low temperature superconducting material upon said substrate, wherein said multiple films are stacked, slitted, interleaved, and electrically connected into a stacked continuous electromagnetic coil arrangement.

2. The device of claim 1, wherein said multilayer film comprises the basic unit of current carrying element of the stacked continuous electromagnetic coil assembly.

3. The device of claim 1, wherein the electrical connection between adjacent multilayer films consists of a pressed or soldered connection between said adjacent multilayer films.

4. The device of claim 1, wherein said precursor superconducting material is a high temperature superconducting material selected from either a stoichiometric or non-stoichiometric mixture of chemical elements of an oxide superconductor.

5. The device of claim 1, wherein said precursor superconducting material is a high temperature superconducting material and each multilayer film has a non-superconducting buffer layer or layers between said substrate and said high temperature superconducting material.

6. The device of claim 1, wherein said superconducting precursor material is a high temperature superconductor selected from the following: Bi—Sr—Ca—Cu—O, (Bi, Pb)—Sr—Ca—Cu—O superconducting material, Re—Ba—Cu—O superconducting material, Tl—Ba—Ca—Cu—O superconducting material, and Hg—Ba—Ca—Cu—O superconducting material.

7. The device claim 1, wherein said precursor superconducting material is a low temperature superconducting selected from the following: Hg, Pb, Nb, Va, Ti, Al, Sn, In, La, Ta, Nb—Ti, Nb—Al, Nb—Sn, Nb—Ge, and Mg—B.

8. The device of claim 1, wherein said multilayer films each include a noble metallic coating upon said superconducting precursor material to enhance electric and thermal stability.

9. The device of claim 1, wherein said multilayer films each include a dielectric coating to provide electrical insulation and environmental protection.

10. The device of claim 1, wherein said multilayer films each include physical and/or chemical defects in said superconducting precursor material to enhance the electrical pinning force which increases the critical current of said superconducting multilayer films.

11. The device of claim 1, wherein said superconducting electromagnetic coil is mechanically supported and/or thermally cooled/heated using an external support structure.

12. The device of claim 11, wherein said external mechanical support structure includes ferromagnetic material to enhance the central magnetic field, change the magnetic inductance/reluctance and/or reduce the stray fringe magnetic field.

13. A superconducting electromagnetic coil device consisting of:

multiple superconducting multilayer films, each having:

a generally planar, thin, metallic, electrically conducting but non-superconducting substrate template and a precursor high or low temperature superconducting material upon said substrate, wherein each multilayer film has an electrical break and said multilayer films are stacked and electrically connected into a continuous electromagnetic coil arrangement.

14. The device of claim 13, wherein said multilayer film comprises the basic unit of current carrying element of the stacked continuous electromagnetic coil assembly.

15. The device of claim 13, wherein said electrical connection between adjacent multilayer films consists of a pressed or soldered contact and said electrical connection is through said electrically conducting substrate.

16. The device of claim 13, wherein said precursor superconducting material is a high temperature superconducting material selected from either a stoichiometric or non-stoichiometric mixture of chemical elements of an oxide superconductor.

17. The device of claim 13, wherein said precursor superconducting material is a high temperature superconducting material and each multilayer film has an electrically conducting but non-superconducting buffer layer or layers between said electrically conducting substrate and said high temperature superconducting material.

18. The device of claim 13, wherein said superconducting precursor material is a high temperature superconductor selected from the following: Bi—Sr—Ca—Cu—O, (BiPb)—Sr—Ca—Cu—O superconducting material, Re—Ba—Cu—O superconducting material, Tl—Ba—Ca—Cu—O superconducting material, and Hg—Ba—Ca—Cu—O superconducting material.

19. The device if claim 13, wherein said precursor superconducting material is a low temperature superconducting selected from the following: Hg, Pb, Nb, Va, Ti, Al, Sn, In, La, Ta, Nb—Tl, Nb—Al, Nb—Sn, Nb—Ge and Mg—B.

20. The device of claim 13, wherein said multilayer films include a noble metallic coating upon said superconducting precursor material to enhance electric and thermal stability.

21. The device of claim 13, wherein said multilayer films each include a dielectric coating to provide electrical insulation and environmental protection.

22. The device of claim 13, wherein said multilayer films each include physical and/or chemical defects in said superconducting precursor material to enhance the electrical pinning force which increases the critical current of said superconducting multilayer films.

23. The device of claim 13, wherein said superconducting electromagnetic coil is mechanically supported and/or thermally cooled/heated using an external support structure.

24. The device of claim 23, wherein said external mechanical support structure includes ferromagnetic material to enhance the central magnetic field, change the magnetic inductance/reluctance and/or reduce the stray fringe magnetic field.

25. A superconducting electromagnetic coil device consisting of:

multiple superconducting multilayer films, each having:

a discrete, generally planar, thin, non-superconducting substrate template and a precursor high or low temperature superconducting material upon said substrate, wherein each multilayer film has an electrical break and is separately powered, and said multiple films are electrically connected to a common electrical buss.

26. The device of claim 25, wherein said multilayer film comprises the basic unit of current carrying element of the stacked continuous electromagnetic coil assembly.

27. The device of claim 25, wherein said electrical connection between said multilayer films is to said common electrical buss and each said multilayer film is individually powered.

28. The device of claim 25, wherein said precursor superconducting material is a high temperature superconducting material selected from either a stoichiometric or non-stoichiometric mixture of chemical elements of an oxide superconductor.

29. The device of claim 25, wherein said precursor superconducting material is a high temperature superconducting material and each multilayer film has a non-superconducting buffer layer or layers between said substrate and said high temperature superconducting material.

30. The device of claim 25, wherein said superconducting precursor material is a high temperature superconductor selected from the following: Bi—Sr—Ca—Cu—O, (Bi, Pb)—Sr—Ca—Cu—O superconducting material, Re—Ba—Cu—O superconducting material, Tl—Ba—Ca—Cu—O superconducting material, and Hg—Ba—Ca—Cu—O superconducting material.

31. The device if claim 25, wherein said precursor superconducting material is a low temperature superconducting selected from the following: Hg, Pb, Nb, Va, Ti, Al, Sn, In, La, Ta, Nb—Ti, Nb—Al, Nb—Sn, Nb—Ge, and Mg—B.

32. The device of claim 25, wherein said multilayer films each include a noble metallic coating upon said superconducting precursor material to enhance electric and thermal stability.

33. The device of claim 25, wherein said multilayer films each include a dielectric coating to provide electrical insulation and environmental protection.

34. The device of claim 25, where said multilayer films each include physical and/or chemical defects in said high or low temperature superconducting precursor material to enhance the electrical pinning force which increases the critical current of said superconducting multilayer films.

35. The device of claim 25, wherein said superconducting electromagnetic coil is mechanically supported and/or thermally cooled/heated using an external support structure.

36. The device of claim 35, wherein said external mechanical support structure includes ferromagnetic material to enhance the central magnetic field, change the magnetic inductance/reluctance, and/or reduce the stray fringe magnetic field.

37. A superconducting trapped or induced field coil device consisting of:

multiple superconducting multilayer films, each having:

a discrete, generally planar, thin, non-superconducting substrate template and a precursor high or low temperature superconducting material upon said substrate, wherein each multilayer film is stacked and said multilayer films are powered via an external induced/time varying magnetic field forming a stacked trapped or induced field coil device.

38. The device of claim 37, wherein said multilayer film comprises the basic unit of current carrying element of the stacked discrete trapped or induced coil assembly.

39. The device of claim 37, wherein said external induced magnetic field is generated from a permanent, superconducting, or non-superconducting magnet.

40. The device of claim 37, wherein said precursor superconducting material is a high temperature superconducting material selected from either a stoichiometric or non-stoichiometric mixture of chemical elements of an oxide superconductor.

41. The device of claim 37, wherein said precursor superconducting material is a high temperature superconducting material and each multilayer film has a non-superconducting buffer layer or layers between said substrate and said high temperature superconducting material.

42. The device of claim 37, wherein said superconducting precursor material is a high temperature superconductor selected from the following: Bi—Sr—Ca—Cu—O, (Bi, Pb)—Sr—Ca—Cu—O superconducting material, Re—Ba—Cu—O superconducting material, Tl—Ba—Ca—Cu—O superconducting material, and Hg—Ba—Ca—Cu—O superconducting material.

43. The device if claim 37, wherein said precursor superconducting material is a low temperature superconducting selected from the following: Hg, Pb, Nb, Va, Ti, Al, Sn, In, La, Ta, Nb—Ti, Nb—Al, Nb—Sn, Nb—Ge, and Mg—B.

44. The device of claim 37, wherein said multilayer films include a noble metallic coating upon said superconducting precursor material to enhance electric and thermal stability.

45. The device of claim 37, wherein said multilayer films each include a dielectric coating to provide electrical insulation and environmental protection.

46. The device of claim 37, films each include physical and/or chemical defects in said high or low temperature superconducting precursor material to enhance the electrical pinning force which increases the critical current of said multilayer films.

47. The device of claim 37, wherein said superconducting trapped or induced field coil is mechanically supported and/or thermally cooled/heated using an external support structure.

48. The device of claim 47, wherein said external mechanical support structure includes ferromagnetic material to enhance the central magnetic field, change the magnetic inductance/reluctance, and/or reduce the stray fringe magnetic field.

* * * * *